United States Patent [19]
Kolluri

[11] Patent Number: 5,552,741
[45] Date of Patent: Sep. 3, 1996

[54] HIGH IMPEDANCE COMMON-EMITTER AMPLIFIER STAGE

[75] Inventor: Madhav V. Kolluri, Sunnyvale, Calif.

[73] Assignee: Maxim Integrated Products, Sunnyvale, Calif.

[21] Appl. No.: 365,902

[22] Filed: Dec. 29, 1994

[51] Int. Cl.$^6$ .......................... G06G 7/12; H03K 17/60; H03K 3/00; H03K 3/18
[52] U.S. Cl. .......................... 327/560; 327/563; 327/576; 327/484; 327/108; 327/112; 330/262; 330/263
[58] Field of Search ...................... 327/560, 561, 327/563, 482, 483, 484, 489, 490, 108, 112, 309, 576, 262, 263; 330/255, 259, 261

[56] References Cited

U.S. PATENT DOCUMENTS

| | | | |
|---|---|---|---|
| 3,681,619 | 8/1972 | Remy | 327/309 |
| 3,864,641 | 2/1975 | Ahmed | 330/259 |

*Primary Examiner*—David C. Nelms
*Assistant Examiner*—Trong Phan
*Attorney, Agent, or Firm*—Blakely, Sokoloff, Taylor & Zafman

[57] ABSTRACT

A high input impedance common-emitter amplifier stage is disclosed. This amplifier stage utilizes a transistor to buffer the base drive from the input stage of a Darlington circuit. This buffer action increases the input impedance of the common-emitter stage by a factor of beta ($\beta$) of the buffering transistor. Various embodiments are disclosed.

19 Claims, 3 Drawing Sheets

HIGH IMPEDANCE COMMON-EMITTER AMPLIFIER STAGE

BACKGROUND OF THE INVENTION

1. Field of the Invention

A high input impedance common-emitter amplifier stage.

2. Background of the Related Art

Low power operational amplifiers with a rail to rail output stage are designed with the goal of maintaining a high open loop gain while driving heavy output loads. Since the output of a rail-to-rail amplifier has to swing all the way to the supply rails, the classical class-AB voltage follower buffer implemented with emitter followers cannot be used. Instead, the push-pull transistors must be configured in a common-emitter configuration. In addition, this stage must provide high voltage gain because the addition of another gain stage complicates the task of frequency compensation of the amplifier.

A simplified schematic of a conventional amplifier circuit with a rail-to rail output is shown in FIG. 1. This conventional amplifier circuit comprises two NPN transistors Q1 and Q2, arranged in a Darlington configuration. The circuit also comprises an PNP transistor Q3, which provides a rail-to-rail output. The base of Q1 is driven by the input transconductance stage GM, while the base of Q3 is driven by PNP drive and bias circuitry. Current source I1 biases Q1 to maintain a minimum current through Q1 and to minimize phase shift. Such a conventional circuit is disadvantageous because the input impedance of the Darlington common-emitter stage limits the open loop gain of the circuit. This is especially true when the amplifier is built in a high frequency process often characterized by low current gain (i.e., where the value of β is low).

FIGS. 2 and 3 depict two other conventional techniques used to increase the input impedance of the Darlington stage. The circuit in FIG. 2 uses additional emitter-followers Q4 and Q5 to increase the input impedance of the circuit. Specifically, the circuit in FIG. 2 utilizes two transistors, Q4 and Q5 and two current sources I2 and I3, in addition to the Darlington configuration of FIG. 1. Current source I3 biases Q5 to maintain a minimum current through Q5 and to minimize phase shift. I3 also provides the base current for Q4. Current source I2 provides the bias current for Q4 and the base current for Q1. I1 biases Q1 to maintain a minimum current through Q1 and to minimize phase shift. A drawback of this technique is that the phase shift resulting from the use of additional emitter-followers reduces the phase margin of the circuit, especially when they are biased at low currents to minimize power dissipation.

The circuit in FIG. 3 uses base current cancellation to increase the input impedance. The circuit of FIG. 3 utilizes four transistors, Q4, Q5, Q6 and Q7 in addition to the Darlington configuration of FIG. 1. In this circuit, the current through Q4 is equal to the current through Q1 (assuming base currents are relatively low). It follows then that the base current of Q4 is substantially equal to the base current of Q1. The base current of Q4 is mirrored by Q5 to Q6, and as a result, the current through Q7 is also substantially equal to the base current of Q4 and thus of Q1. As a result, the base current of Q1 is mostly provided by Q7, effectively increasing the input impedance of the circuit. However, the cancellation technique provided by this circuit can only achieve a three to four-fold increase in input impedance due to dissimilar collector-base voltages of the cancellation transistors.

Accordingly, there is a need in the technology to provide a high input impedance common-emitter amplifier stage. There is a also a need in the technology to provide a circuit with a high input impedance common-emitter amplifier stage which can maintain identical collector-base voltages in the cancellation circuit.

BRIEF SUMMARY OF THE INVENTION

A high input impedance common-emitter amplifier stage is disclosed. This amplifier stage utilizes a transistor to buffer the base drive from the input stage of a Darlington circuit. This buffer action increases the input impedance of the common-emitter stage by a factor of beta (β) of the buffering transistor.

DETAILED DESCRIPTION OF THE INVENTION

Figure 4:
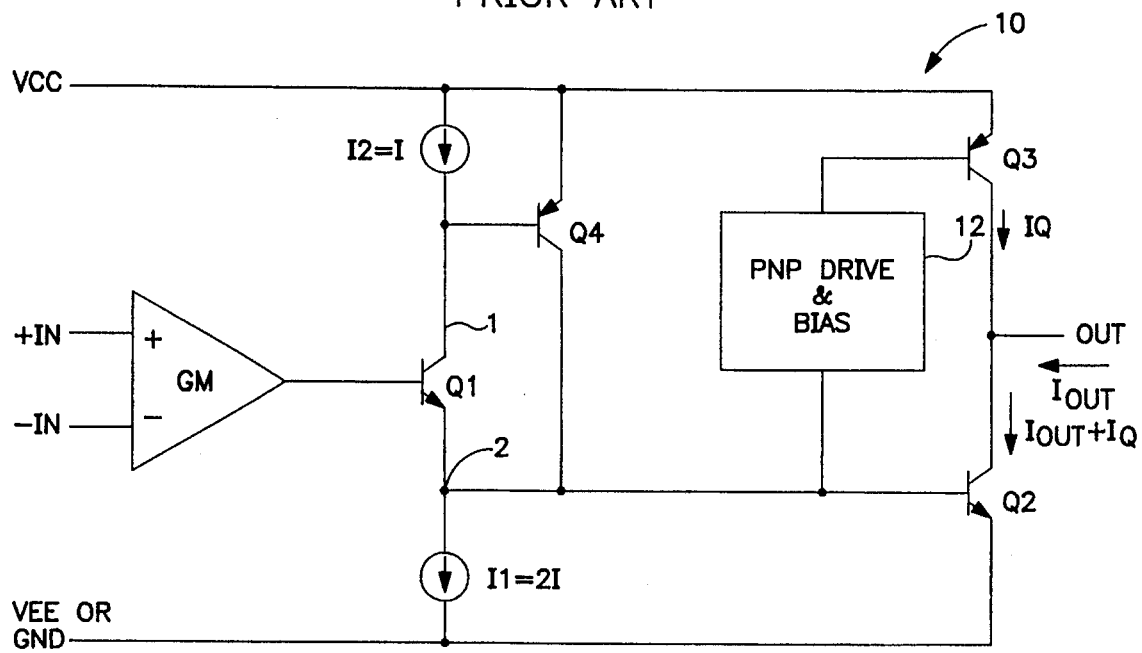
FIG. 4 depicts a schematic diagram of a high input impedance common-emitter amplifier stage in accordance with a preferred embodiment of the present invention.

FIG. 4 illustrates a schematic diagram of a high input impedance common-emitter amplifier stage in accordance with a preferred embodiment of the present invention. The circuit 10 of FIG. 4 comprises two NPN transistors Q1, Q2, two PNP transistors Q3, Q4 and two current sources I1, I2. Q1 and Q2 are arranged in a Darlington configuration, while Q4 buffers the base drive from an input circuit. PNP drive and bias circuitry 12, which may be of conventional design, provides the drive and bias for Q3. $V_{CC}$ provides the supply voltage for the circuit 10 while I1 and the emitter of Q2 may be connected to a second voltage $V_{EE}$, which can be a ground terminal.

As shown in FIG. 4, the current source I1 supplies a current that is twice the magnitude of that provided by I2. In operation, the collector current of Q1 is constrained to be the sum of the fixed current source I2 plus the base current of Q4. The current into node 2, equal to the collector current of Q1 (current source I2 plus the base current of Q4) plus the base current of Q1 and the collector current of Q4, must equal the base current of Q2 plus the current of current source I1. To the extent the current in the collector of Q4 is less than that required to meet this requirement, the voltage of node 2 will be pulled down by the current source I1, turning on Q1 a bit more. This pulls the voltage of node 1 down, turning on Q4 more to supply (within the limit of the β of Q4) the required current to node 2 to return the current in the collector of Q4 to the proper level. When the sink current in Q2 increases, its increased base drive is, in a similar manner, also provided by Q4 (not by Q1 as in a Darlington circuit). This buffer action increases the input impedance of the common emitter stage by a factor of beta (β) of Q4. The input bias current of this circuit is given by:

$$I_{in}=I/\beta_1+I/(\beta_1*\beta_4)+(I_Q+I_{OUT})/(\beta_1*\beta_2*\beta_4) \quad (1)$$

The first two terms in this expression, $I/\beta_1$ and $I/(\beta_1*\beta_4)$, are signal-independent, which creates an offset but does not affect the gain. The third term, $(I_Q+I_{OUT})/(\beta_1*\beta_2*\beta_4)$, is signal dependent and affects the gain.

Figure 1:
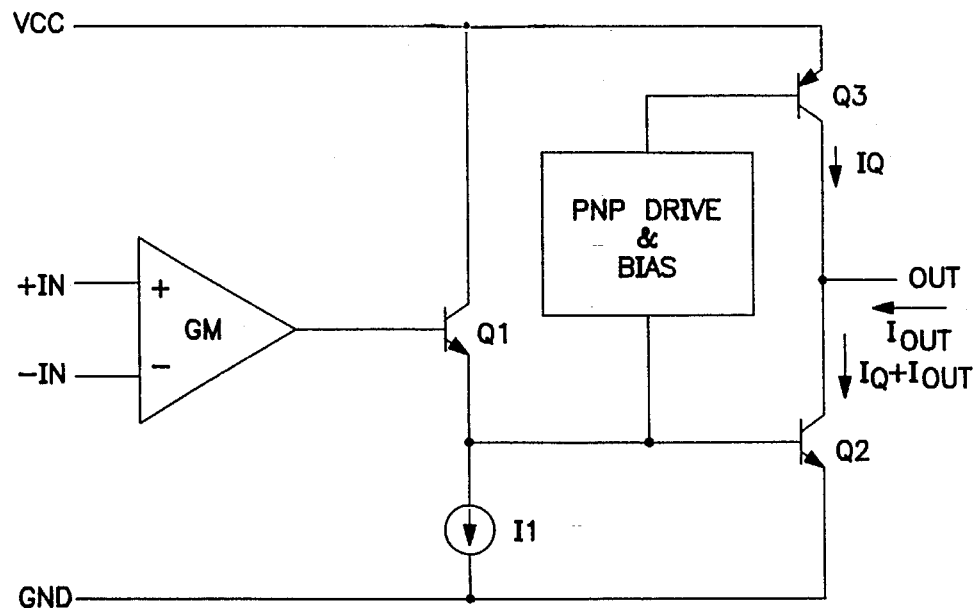
FIG. 1 depicts a schematic diagram of a conventional amplifier with rail-to rail outputs.
Figure 2:
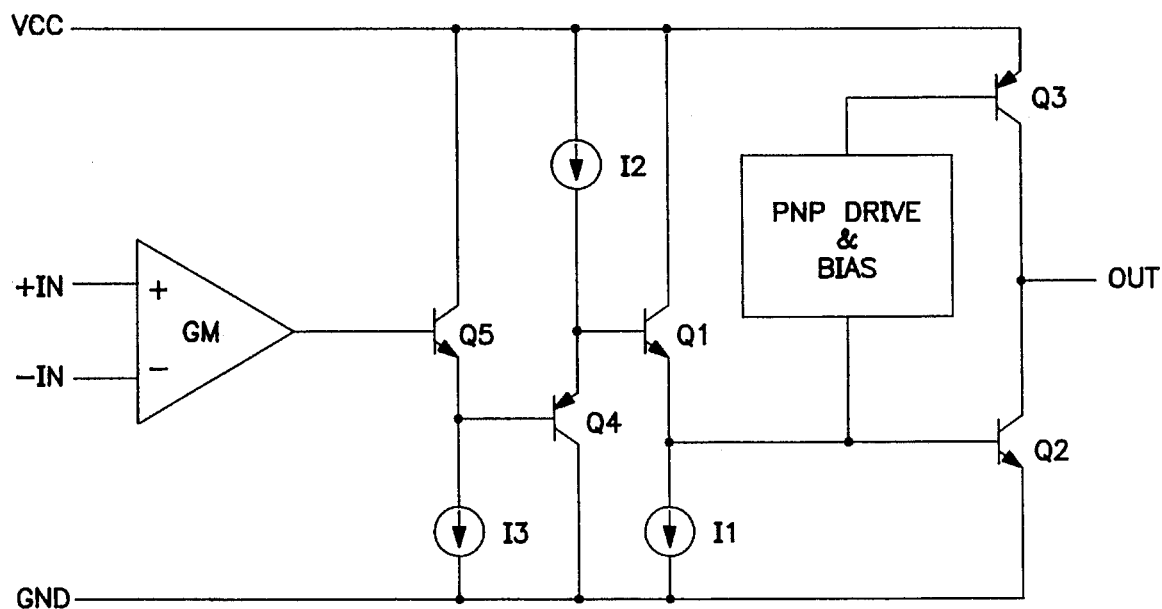
FIG. 2 depicts a schematic diagram of a conventional amplifier circuit utilizing additional emitter followers for increasing input impedance.
Figure 3:
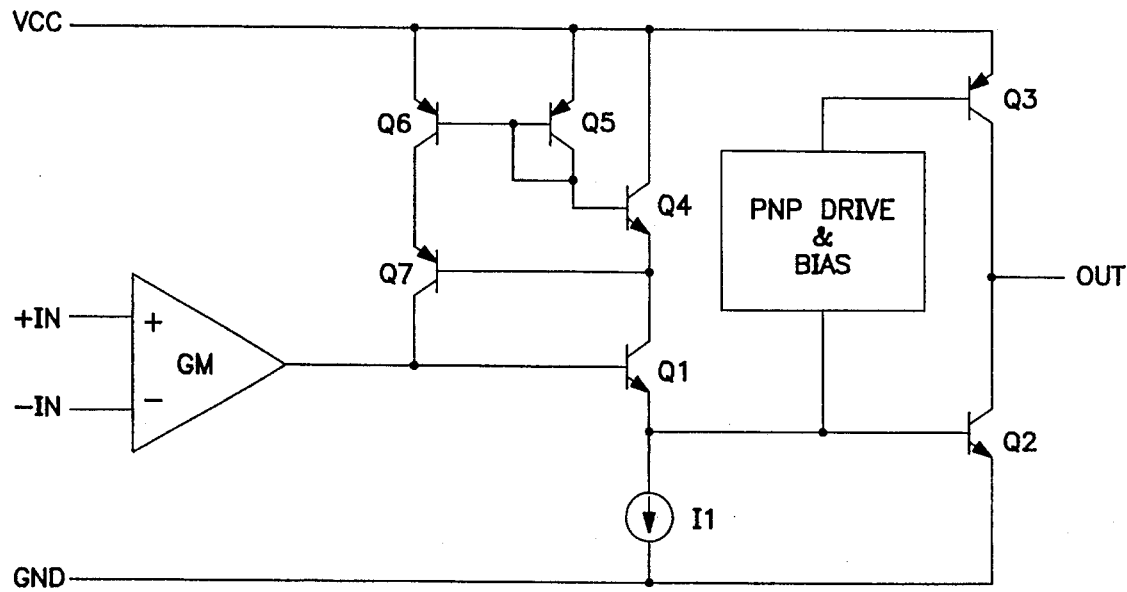
FIG. 3 depicts a schematic diagram of a conventional amplifier circuit utilizing base current cancellation to increase input impedance.

In the conventional Darlington stage as shown in FIG. 1, the input bias current may be expressed as follows:

$$I_{in}=I/\beta_1+(I_Q+I_{OUT})/(\beta_1*\beta_2) \quad (2)$$

Comparing expressions (1) and (2), it can be seen that circuit 10 of the present invention increases the input impedance of the common-emitter stage by factor of $\beta_4$, with a typical value of $\beta_4$ being 75. As a result, the input impedance of the circuit 10 is therefore improved over a Darlington circuit by a factor of 75. In addition, since Q4 operates at unity gain, problems of frequency stability are minimized.

Figure 5:
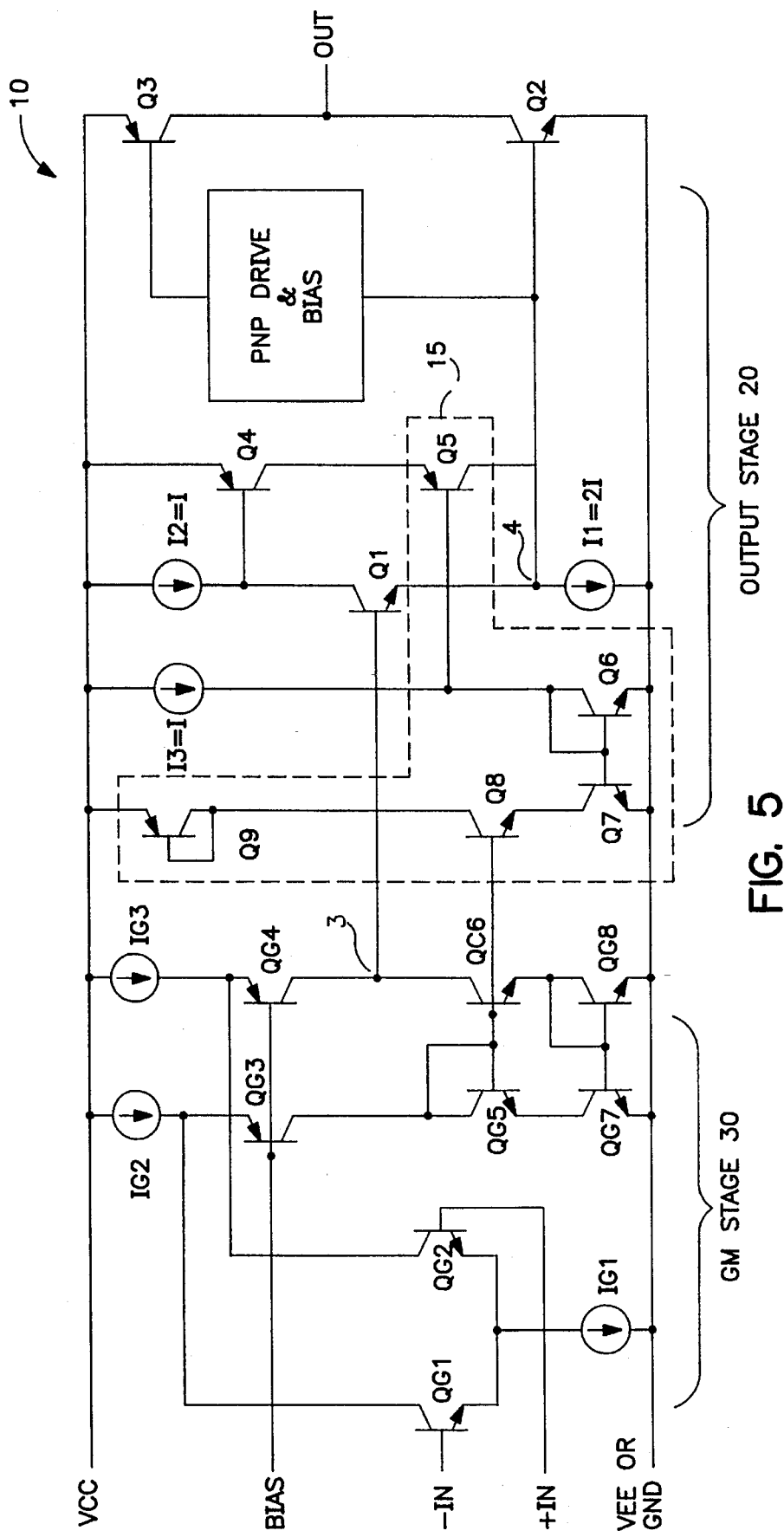
FIG. 5 depicts a schematic diagram of an alternate embodiment of the high input impedance common-emitter amplifier stage used in conjunction with conventional base current cancellation circuitry.

FIG. 5 illustrates an alternate embodiment of the high input impedance common-emitter amplifier stage of the present invention. As shown in FIG. 5, the high input impedance common-emitter amplifier stage 10 is coupled to a conventional base current cancellation circuit 15. The base current cancellation circuit 15 comprises a PNP transistor Q5 and four NPN transistors Q6, Q7, Q8 and Q9. The output stage 20 is coupled to a conventional input transconductance (GM) stage 30.

The transconductance (GM) stage 30 comprises current sources IG1, IG2, IG3, NPN transistors QG1, QG2, QG5, QG6, QG7, QG8 and PNP transistors QG3, QG4. Transistors QG3, QG6, QG7 and QG8 form a super Wilson current mirror which provides a highly accurate current mirror. The BIAS terminal biases QG3 and QG4 to insure the current sources IG2 and IG3 do not saturate. The current sources IG2 and IG3 are equal, and each of the current sources IG2 and IG3 is greater than the current source IG1. When the potential at the noninverting terminal of GM stage 30 is equal to the potential at the inverting terminal of the GM stage 30, the current through QG1 and QG2 from IG2 and IG3 respectively are equal, namely IG1/2. Since the current of IG2 and IG3 each exceeds IG1/2, current components also pass through QG3 and QG4. Since the current components through QG1 and QG2 are equal, the current components through QG3 and QG4 are also equal. The current through QG3 less the base current of Q8 is mirrored by the Super Wilson current mirror to the collector of QG6.

Thus, the current through QG4 into node 3 exceeds the current out of node 3 through QG6 by the base current of Q8, the difference being the base current of Q1. The current is in balance, however, because the current in Q1 (I) is equal to the current in Q6 (I) which is mirrored to Q7 to pass through Q8. Thus, the current in Q8 equals the current in Q1, and the base currents of Q1 and Q8 are therefore equal.

When the potential at the noninverting terminal of the GM stage 30 is more positive than the potential at the inverting terminal, more current will pass through QG2 than before and less current will pass through QG1. As a result, less current will pass through QG4 and more current will pass through QG3. The increased current through QG3 is mirrored to QG6. Thus, there will be more current through QG6 than before and less current through QG4 than before. Node 3 will be pulled down, pulling node 4 down and allowing Q3 to pull the output at node OUT up. Of course, when the potential at the noninverting terminal of the GM stage 30 is less positive than the potential at the inverting terminal, the opposite result will be achieved.

In the arrangement depicted in FIG. 5, the residual base current of Q1 is balanced in the base current cancellation circuit 15 by the base current of Q8, while the collector current of Q5 is approximately the same as that of Q4. The collector current of Q6 is the sum of the current source $I_3$ and the base current of Q5. This current is mirrored by Q7 and flows through Q8. The collector current of Q8 is therefore the same as that of Q1. The addition of Q9 insures that the collector-base voltages of Q1 and Q8 are identical for a given supply voltage and temperature. Thus, the loading of Q1 on the GM stage 30 is exactly balanced by the loading of Q8 to provide an extremely high impedance of the common-emitter stage, which is independent of load and power supply variations.

The high input impedance common-emitter amplifier stage circuit of the present invention may be used in amplifiers. In addition, since a common emitter stage is a general purpose building block, this circuit can be used in many other applications requiring high input impedance.

While the present invention has been disclosed and described with respect to certain preferred embodiments thereof, it will be understood to those skilled in the art that the present invention may be varied without departing from the spirit and scope of the invention. The described embodiments are to be considered in all respects only as illustrative and not restrictive. The scope of the invention is, therefore, indicated by the appended claims rather than the foregoing description. All changes which come within the meaning and range of equivalency of the claims are to be embraced within their scope.

What is claimed is:

1. A high input impedance amplifier stage, comprising:

first and second power supply terminals;

an output terminal;

first and second current sources, each having a first and a second terminal;

first and second NPN transistors, each having a collector, a base and an emitter;

third PNP transistor having a collector, a base and an emitter;

the emitter of the first transistor, the base of the second transistor and the collector of the third transistor being coupled to the first terminal of the first current source;

the collector of the first transistor and the base of the third transistor being coupled to the first terminal of the second current source;

the emitter of the third transistor being coupled to the second terminal of the second current source and the first power supply terminal;

the emitter of the second transistor being coupled to the second terminal of the first current source and the second power supply terminal, the collector of the second transistor being coupled to the output terminal; and the base of the first transistor providing the input to the amplifier stage.

2. The amplifier stage of claim 1, wherein the first current source supplies twice the amount of current as the second current source.

3. The amplifier stage of claim 1, wherein the second terminal of the second current source is coupled to a first voltage.

4. The amplifier stage of claim 3, wherein the second terminal of the first current source is coupled to a second voltage.

5. The amplifier stage of claim 1, wherein the means for providing the input signal is an input transconductance stage.

6. The amplifier stage of claim 1, further comprising a fourth PNP transistor having a collector, a base and an emitter, wherein its emitter is coupled to the emitter of the third transistor, its collector is coupled to the collector of the second transistor and its base is coupled to the base of the second transistor.

7. The amplifier stage of claim 1, further comprising means for canceling residual base current of the first transistor.

8. The amplifier stage of claim 7, wherein said means for canceling residual base current comprises:

fifth PNP transistor having a collector, a base and an emitter;

sixth, seventh and eighth NPN transistors, each having a collector, a base and an emitter;

third current source having a first and a second terminal;

the emitter of the fifth transistor being coupled to the collector of the third transistor, the collector of the fifth transistor being coupled to the base of the second transistor, the base of the fifth transistor being coupled to the first terminal of the third current source;

the second terminal of the third current source and the second terminal of the second current source being coupled together;

the collector and the base of the sixth transistor, the base of the seventh transistor and the base of the fifth transistor being coupled together;

the emitters of the second, sixth and the seventh transistors being coupled together; and the collector of the eighth transistor being coupled to the other end of the third current source, and the emitter of the eighth transistor being coupled to the collector of the seventh transistor.

9. The amplifier stage of claim 8, wherein the second terminal of the third current source is coupled to the first voltage.

10. The amplifier stage of claim 8, further comprising a ninth PNP transistor having a collector, a base and an emitter, the collector and the base of the ninth transistor being coupled to the collector of the eighth transistor, the emitter of the ninth transistor being coupled to the first voltage.

11. An amplifier circuit, comprising:

a transconductance stage; and an output stage, the output stage having a high input impedance amplifier stage, including:

first and second power supply terminals, an output terminal;

first and second current sources, each having a first and a second terminal, first and second NPN transistors, each having a collector, a base and an emitter, third PNP transistor having a collector, a base and an emitter, the emitter of the first transistor, the base of the second transistor and the collector of the third transistor being coupled to the first terminal of the first current source, the collector of the first transistor and the base of the third transistor being coupled to the first terminal of the second current source, the emitter of the third transistor being coupled to the second terminal of the second current source and the first power supply terminal, the emitter of the second transistor being coupled to the second terminal of the first current source and the second power supply terminal, the collector of the second transistor being coupled to the output terminal, and the base of the first transistor being coupled to the transconductance stage.

12. The amplifier circuit of claim 11, wherein the first current source supplies twice the amount of current as the second current source.

13. The amplifier circuit of claim 11, wherein the second terminal of the second current source is coupled to a first voltage.

14. The amplifier circuit of claim 13, wherein the second terminal of the first current source is coupled to a second voltage.

15. The amplifier circuit of claim 11, wherein the high input impedance amplifier stage further comprises a fourth PNP transistor having a collector, a base and an emitter, wherein its emitter is coupled to the emitter of the third transistor, its collector is coupled to the collector of the second transistor and its base is coupled to the base of the second transistor.

16. The amplifier circuit of claim 11, further comprising a circuit for canceling residual base current of the first transistor.

17. The amplifier circuit of claim 16, wherein said circuit for canceling residual base current comprises:

fifth PNP transistor having a collector, a base and an emitter;

sixth, seventh and eighth NPN transistors, each having a collector, a base and an emitter;

the emitter of the fifth transistor being coupled to the collector of the third transistor, the collector of the fifth transistor being coupled to the base of the second transistor;

the collector and the base of the sixth transistor, the base of the seventh transistor and the base of the fifth transistor being coupled together;

the emitters of the second, sixth and the seventh transistors being coupled together; and the collector of the eighth transistor being coupled to the first voltage, the emitter of the eighth transistor being coupled to the collector of the seventh transistor, and the base of the eighth transistor being coupled to the transconductance stage.

18. The amplifier circuit of claim 17, wherein the second terminal of the third current source is coupled to the first voltage.

19. The amplifier circuit of claim 17, further comprising a ninth PNP transistor having a collector, a base and an emitter, the collector and the base of the ninth transistor being coupled to the collector of the eighth transistor, the emitter of the ninth transistor being coupled to the first voltage.

* * * * *